US012609276B2

(12) United States Patent
Levi et al.

(10) Patent No.: US 12,609,276 B2
(45) Date of Patent: Apr. 21, 2026

(54) MIXED-GAS SPECIES PLASMA SOURCE SYSTEM

(71) Applicant: FEI Company, Hillsboro, OR (US)

(72) Inventors: David Levi, Hillsboro, OR (US); Kevin Kagarice, Hillsboro, OR (US); Daniel Totonjian, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 105 days.

(21) Appl. No.: 18/393,061

(22) Filed: Dec. 21, 2023

(65) Prior Publication Data

US 2025/0210303 A1      Jun. 26, 2025

(51) Int. Cl.
H01J 37/30 (2006.01)
(52) U.S. Cl.
CPC ..... H01J 37/3002 (2013.01); H01J 2237/006 (2013.01)
(58) Field of Classification Search
None
See application file for complete search history.

(56) References Cited

U.S. PATENT DOCUMENTS

| | | | |
|---|---|---|---|
| 3,417,779 A | * | 12/1968 | Golay ..................... B01F 23/19 239/398 |
| 4,612,077 A | * | 9/1986 | Tracy ................. H01J 37/3244 156/345.37 |
| 6,230,651 B1 | | 5/2001 | Ni et al. |
| 8,076,650 B2 | | 12/2011 | Smith et al. |

| | | | |
|---|---|---|---|
| 8,405,054 B2 | | 3/2013 | Smith et al. |
| 8,692,217 B2 | | 4/2014 | Smith et al. |
| 9,087,671 B2 | | 7/2015 | Graupera et al. |
| 9,159,534 B2 | * | 10/2015 | Graupera ................ H01J 37/08 |
| 9,627,174 B2 | * | 4/2017 | Schwind ................. H01J 37/08 |
| 9,728,375 B2 | * | 8/2017 | Rasmussen ........... H01J 37/023 |
| 10,763,079 B1 | * | 9/2020 | Graham .................. H01J 37/28 |
| 11,152,189 B2 | * | 10/2021 | Bishop .................. H01J 37/244 |
| 11,214,874 B2 | * | 1/2022 | Foster .............. H01J 37/32963 |
| 11,961,925 B2 | * | 4/2024 | Stradins ................ H10D 62/83 |
| 12,002,672 B2 | * | 6/2024 | Collings .............. H01J 49/067 |
| 12,061,159 B2 | * | 8/2024 | Totonjian .......... G01N 23/2208 |

(Continued)

OTHER PUBLICATIONS

EP24221511.9, "Extended European Search Report", Aug. 13, 2025, 14 pages.

*Primary Examiner* — Srinivas Sathiraju
(74) *Attorney, Agent, or Firm* — Kilpatrick Townsend & Stockton LLP

(57) ABSTRACT

An ion beam system including a plasma source tube defining a plasma source chamber, a first gas reservoir housing a first gas, a second gas reservoir housing a second gas, a first controller fluidly coupled to the first gas reservoir and configured to control a first flow rate of the first gas, and a second controller fluidly coupled to the second gas reservoir and configured to control a second flow rate of the second gas. The system also includes a first capillary constriction including a first end fluidly coupled to the first controller and a second end fluidly coupled to the plasma source chamber, and a second capillary constriction including a third end fluidly coupled to the second controller and a fourth end fluidly coupled to the plasma source chamber, where the first capillary constriction and the second capillary constriction are distinct.

20 Claims, 9 Drawing Sheets

(56)                 References Cited

U.S. PATENT DOCUMENTS

| | | | | |
|---|---|---|---|---|
| 2004/0136359 A1* | 7/2004 | Ivancovsky | ........... | H04J 3/1694 |
| | | | | 370/352 |
| 2005/0103272 A1* | 5/2005 | Koops | ................. | H01J 37/3056 |
| | | | | 118/723 EB |
| 2005/0199806 A1* | 9/2005 | Cafri | ..................... | H01J 37/026 |
| | | | | 250/306 |
| 2007/0170995 A1* | 7/2007 | Dutton | ..................... | H05H 1/24 |
| | | | | 331/107 R |
| 2008/0179545 A1 | 7/2008 | Perel et al. | | |
| 2009/0314958 A1* | 12/2009 | Tieger | ............... | H01L 21/26513 |
| | | | | 250/492.2 |
| 2010/0187448 A1* | 7/2010 | Tikovsky | ................ | H01J 37/08 |
| | | | | 250/492.21 |
| 2011/0084207 A1* | 4/2011 | Zhang | ................. | H01J 37/3005 |
| | | | | 250/397 |
| 2011/0171817 A1* | 7/2011 | Lee | ................... | H01L 21/26506 |
| | | | | 438/513 |
| 2011/0260047 A1* | 10/2011 | Lee | ................... | H01L 21/26513 |
| | | | | 250/282 |
| 2012/0119113 A1 | 5/2012 | Colvin et al. | | |
| 2013/0248490 A1* | 9/2013 | Rasmussen | ............... | B05B 1/30 |
| | | | | 216/83 |
| 2013/0284593 A1 | 10/2013 | Shichi et al. | | |
| 2016/0093470 A1* | 3/2016 | Kagarice | ................. | H01J 37/05 |
| | | | | 250/311 |
| 2016/0155607 A1* | 6/2016 | Rasmussen | ............. | B05B 1/005 |
| | | | | 239/11 |
| 2016/0343537 A1* | 11/2016 | Shanley | ................... | H01J 37/18 |
| 2016/0350614 A1* | 12/2016 | Warschauer | .......... | G06T 7/0004 |
| 2019/0189402 A1 | 6/2019 | Yedave et al. | | |
| 2020/0314181 A1* | 10/2020 | Eran | ....................... | H04L 67/10 |
| 2020/0373115 A1* | 11/2020 | Mohammadi-Gheidari | ................ | |
| | | | | H01J 37/153 |
| 2021/0141413 A1* | 5/2021 | Levi | ........................... | G06F 1/14 |
| 2021/0296086 A1* | 9/2021 | Bishop | ................... | H01J 37/244 |
| 2022/0140161 A1* | 5/2022 | Stradins | ................... | H10F 10/11 |
| | | | | 257/774 |
| 2023/0101787 A1* | 3/2023 | Stiller | ..................... | H01J 37/21 |
| | | | | 313/310 |
| 2023/0341341 A1* | 10/2023 | Totonjian | .......... | G01N 23/2206 |
| 2024/0418660 A1* | 12/2024 | Totonjian | .......... | G01N 23/2257 |
| 2025/0055668 A1* | 2/2025 | Manevich | ................ | H04L 7/10 |

* cited by examiner

600

Decouple the bypass manifold and plasma tube
610

Open the controller relief ports
620

Instruct a first controller to open a first variable outlet pressure valve to release a first gas at a first release rate
710

Instruct a second controller to open a second variable outlet pressure valve to release a second gas at a second release rate
720

MIXED-GAS SPECIES PLASMA SOURCE SYSTEM

BACKGROUND

Charged particle beam systems are used in a variety of applications including the manufacturing, repair, and inspection of miniature devices, such as integrated circuits, magnetic recording heads, and photolithography masks. In a certain type of charged particle beam system, ions are generated by ionizing a gas in a plasma source. These ions are then directed towards the sample in a beam to perform a processing or imaging step, as well as make physical alterations to the sample. The ion species utilized for this purpose can be tailored to a specific sample or process by altering the gas species ionized in the plasma source. Certain samples or processes require a mixture of multiple unique ion species, dictating a mixture of multiple unique gas species in the plasma source. New charged particle beam systems optimizing this gas mixing are desired.

BRIEF SUMMARY

One aspect of the disclosure provides for an ion beam system. The ion beam system also includes a plasma source tube defining a plasma source chamber. The system also includes a first gas reservoir housing a first gas and a second gas reservoir housing a second gas. The system also includes a first controller fluidly coupled to the first gas reservoir and configured to control a first flow rate of the first gas, and a second controller fluidly coupled to the second gas reservoir and configured to control a second flow rate of the second gas. The system also includes a first capillary constriction including a first end fluidly coupled to the first controller and a second end fluidly coupled to the plasma source chamber, and a second capillary constriction including a third end fluidly coupled to the second controller and a fourth end fluidly coupled to the plasma source chamber, where the first capillary constriction and the second capillary constriction are distinct.

Another aspect of the disclosure provides for an ion beam system. The ion beam system also includes a plasma source tube defining a plasma source chamber. The system also includes a first gas reservoir housing a first gas species and a second gas reservoir housing a second gas species. The system also includes a first controller fluidly coupled to the first gas reservoir and configured to control a first flow rate of the first gas species. The system also includes a first capillary constriction including a first end fluidly coupled to the first controller and a second end fluidly coupled to the plasma source chamber. The system also includes a computer system in communication with the first controller and configured to provide instructions to operate the first controller.

Yet another aspect of the disclosure provides for a non-transitory computing-device readable storage medium on which computing-device readable instructions of a program are stored. The non-transitory computing-device readable storage medium also includes instructing a first controller to open a first variable outlet pressure valve to release a first gas from a first gas reservoir at a first flow rate into a plasma source chamber defined in a plasma source tube via a first capillary constriction. The medium also includes instructing a second controller to open a second variable outlet pressure valve to release a second gas from a second gas reservoir at a second flow rate into the plasma source chamber via a second capillary constriction such that the first and second gas mix in the plasma source chamber, where the second capillary constriction is distinct from the first capillary constriction.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
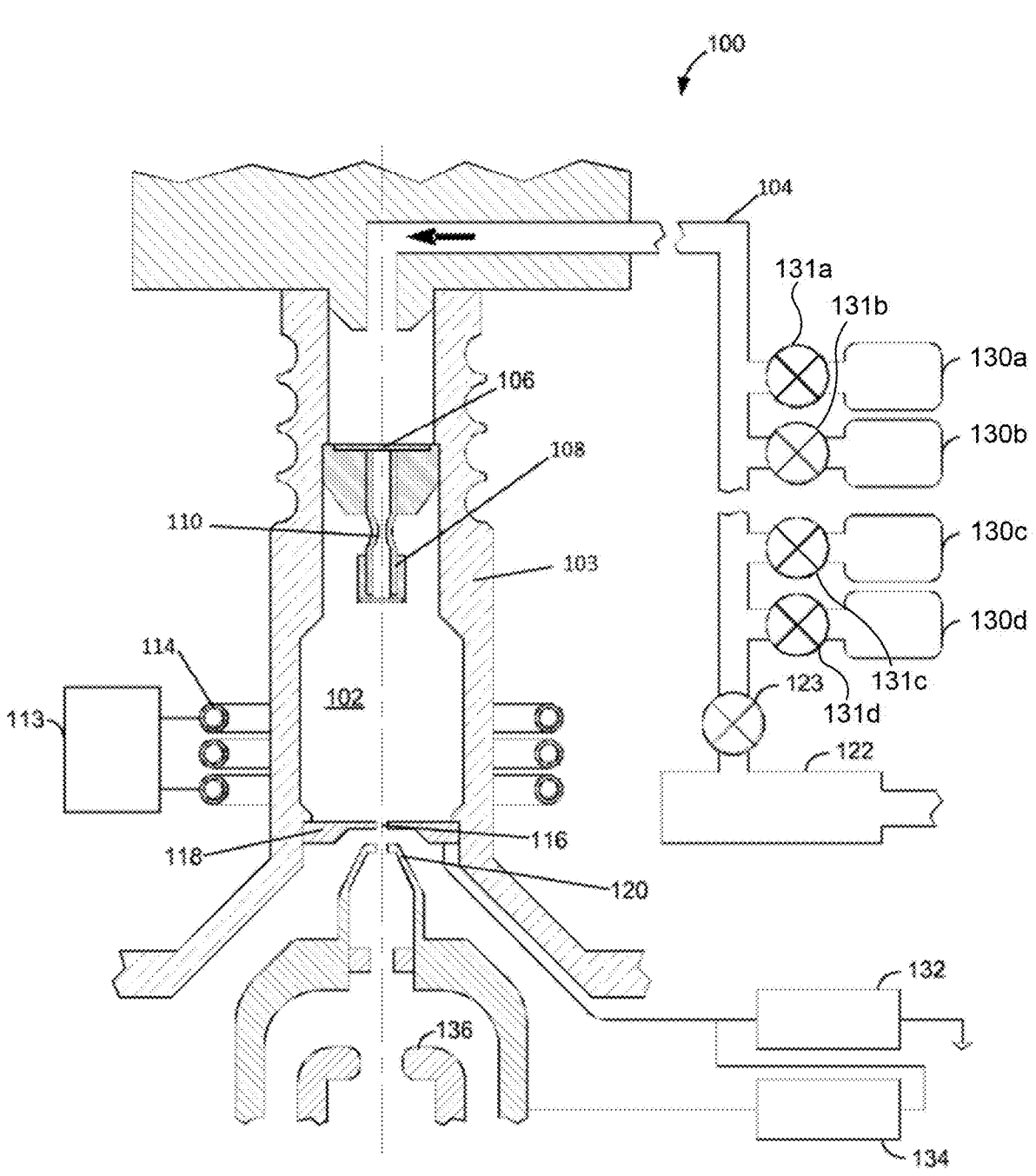
FIG. 1 depicts a simplified cross-sectional view of an example charged particle system.

An ion beam system is a type of charged particle beam system used to alter samples (e.g., by milling). In particular, focused ion beams (FIBs) mill by physically removing atoms and molecules from the surface of a sample through a process known as physical sputtering. FIB systems generally operate by directing a focused beam of ions over the surface of a sample, such as a raster pattern. In one example, these ions can be extracted from a plasma source, and accelerated and focused onto the sample using a series of apertures and electrostatic lenses. Specifically, these plasma sources ionize a gas, or mixture of gases, in a plasma source chamber and extract ions to form a beam that is focused on a sample. The particular material of a sample, or the process being performed upon that material, may require a mixture of process gasses at a particular ratio in order to create a mixed species ion beam that optimally mills the sample. Providing the specific ratio of gas species in the gas mixture for each particular sample can be challenging.

One method of providing a gas mixture includes providing a pre-mixed gas mixture into the plasma source. While this may be feasible where the pre-mixed gas mixture includes the precise ratio of gases used to extract the optimal ion beam to mill the sample (e.g., to mill through non-uniform, or varying types of, material layers), issues may arise when the pre-mixed gas mixture does not include this particular ratio of gases. Specifically, because the gas mixture is pre-mixed, the ratio of gases in the gas mixture cannot be dynamically changed (e.g., the ratio of gases in the gas mixture cannot be changed as the sample is being milled). Accordingly, using a pre-mixed gas mixture offers less flexibility.

Another method of providing a gas mixture may include mixing the gases at a high-pressure gas inlet (e.g., greater than 1 bar) just outside of the plasma chamber and using constriction to introduce the gas mixture into the plasma source chamber. However, it can be difficult to control and adjust the desired partial pressure of each gas within the plasma cell if mixing is done at high pressure prior to a constriction. Further, the constriction area (e.g., from precision crimping a tube) can be different between each system due to variability in manufacturing, which can lead to the constriction having an irregular cross-sectional shape and leading to a difficulty in consistently controlling the pressure with this method. Inconsistencies in leak rates may be seen in different units or even over time in the same unit. Even further, changing the gas mixture may take a long time (e.g., around 10 minutes) and lead to an unnecessary waste of expensive gas, as the high-pressure gas from the entire gas supply line must be removed in order to provide a new gas mixture. As such, using this high pressure drop for a constriction may be difficult, inconsistent, and expensive.

The present disclosure provides a plasma source system including controllers that each can selectively and individually control delivery of a particular gas species. In particular, each controller controls the pressure or differential flow rate of each gas species being mixed into the gas mixture so that the composition of the gas mixture can be more dynamically and accurately controlled to accommodate different sample materials. The present disclosure also includes capillary constrictions that are fluidly separate from the gas supply lines so that the gas in the capillary constrictions may be evacuated without requiring evacuation of the gas supply lines. This may minimize gas waste and save costs. The capillary constrictions may also be smaller than conventional gas supply lines to further minimize gas waste and save costs by evacuating even less gas than conventional plasma source systems.

Although the remaining portions of the description will routinely reference FIB systems, it will be readily understood by the skilled artisan that the technology is not so limited. The present designs may be employed with other types of charged particle microscope, such as scanning electron microscopes (SEM), transmission electron microscope (TEM), scanning transmission electron microscope (STEM), dual beam systems including an ion beam source and an electron beam source, reflection electron microscopes (REM), circuit editing microscopes, or the like. Accordingly, the disclosure and claims are not to be considered limited to any particular example microscope discussed, but can be utilized broadly with any number of charged particle microscopes that may exhibit some or all of the electrical or chemical characteristics of the discussed examples.

FIG. 1 depicts an example charged particle system 100 (e.g., a FIB system). For the sake of brevity, additional details regarding the charged particle system are not shown, such as the focusing column and sample chamber. Gas is provided to a plasma source chamber 102 within a plasma source tube 103 from an external gas supply line 104 through a gas filter 106 and then to a tube 108 with a constriction 110. Energy is fed into the plasma source chamber 102 from a radiofrequency (RF) power supply 113 by antenna coils 114 and ions are extracted through a source electrode aperture 116 in a source electrode 118 by an extractor electrode 120.

Multiple gas sources such as a first gas reservoir 130a, a second gas reservoir 130b, a third gas reservoir 130c, and a fourth gas reservoir 130d supply gas into the gas supply line 104 through respective valves 131a, 131b, 131c, 131d (e.g., pressure regulator, bypass valve, or the like). Each of the gas reservoirs 130a, 130b, 130c, 130d may include a gas species for generating plasma (e.g., oxygen, xenon, krypton, argon, nitrogen, hydrogen, or the like). Gas flows in a downstream direction from the gas reservoirs 130a, 130b, 130c, 130d to the plasma source chamber 102 through the constriction 110 in the tube 108 and out through the aperture 116 in the source electrode 118. The pump 122 may be connected to the gas supply line 104 through the valve 123 and may be activated to remove gas from the plasma source chamber 102 through the tube 108 and the gas supply line 104. An ion column pump (not shown) extracts gas from the plasma source chamber 102 through the source electrode aperture 116. A beam voltage supply 132 supplies a high voltage to the plasma in chamber 102 and an extraction voltage supply 134 supplies a voltage to the extraction electrode 120. Extracted ions or electrons are focused by using a focusing electrode 136 toward a sample chamber housing a sample (not shown). To remove a gas from the interior of the plasma source chamber 102, the valve 123 may be activated to pump the gas out in an upstream direction out of the gas supply line 104 and the plasma source tube 103, and in a downstream direction out of the source electrode aperture 116 from main chamber vacuum pump(s) (not shown).

The tube 108 may facilitate a calibrated leak from the gas supply line 104 to the plasma source chamber 102. Specifically, the portion of the plasma source system 100 upstream of the tube 108 may be pressurized to be greater than the portion of the plasma source system 100 downstream of the tube 108 (e.g., in the plasma source chamber 102) such that the gas flows downstream from the gas supply line 104 to the plasma source chamber 102. Additionally, the tube 108 may define the constriction 110 to have a specific diameter (e.g., less than about 1 mm, such as about 5-10 microns) such that the gas flows into the plasma source chamber 102 at a desired pace.

As noted above, it may be difficult to accurately control the partial pressure—and, therefore, the flow rate—of each gas species in the gas mixture just upstream of the tube 108 because the various gas flow rates of the gases are inter-mingled in the large gas supply line 104 before reaching the tube 108. Additionally, because the constriction 110 requires an extremely precise diameter to ensure that the gas enters the plasma source chamber 102 at a precise flow rate, the diameter may be variable between manufacturers and may not be consistent. As such, it would be even more difficult to control the pressure of the gas entering the plasma source chamber 102. Finally, when changing the gas mixture, the entire gas supply line 104 (e.g., the gas in the gas supply line 104 between the valves 123, 131a, 131b, 131c, 131d through to the tube 108) must be evacuated, leading to gas waste as well as requiring a long evacuation time.

Figure 2A:
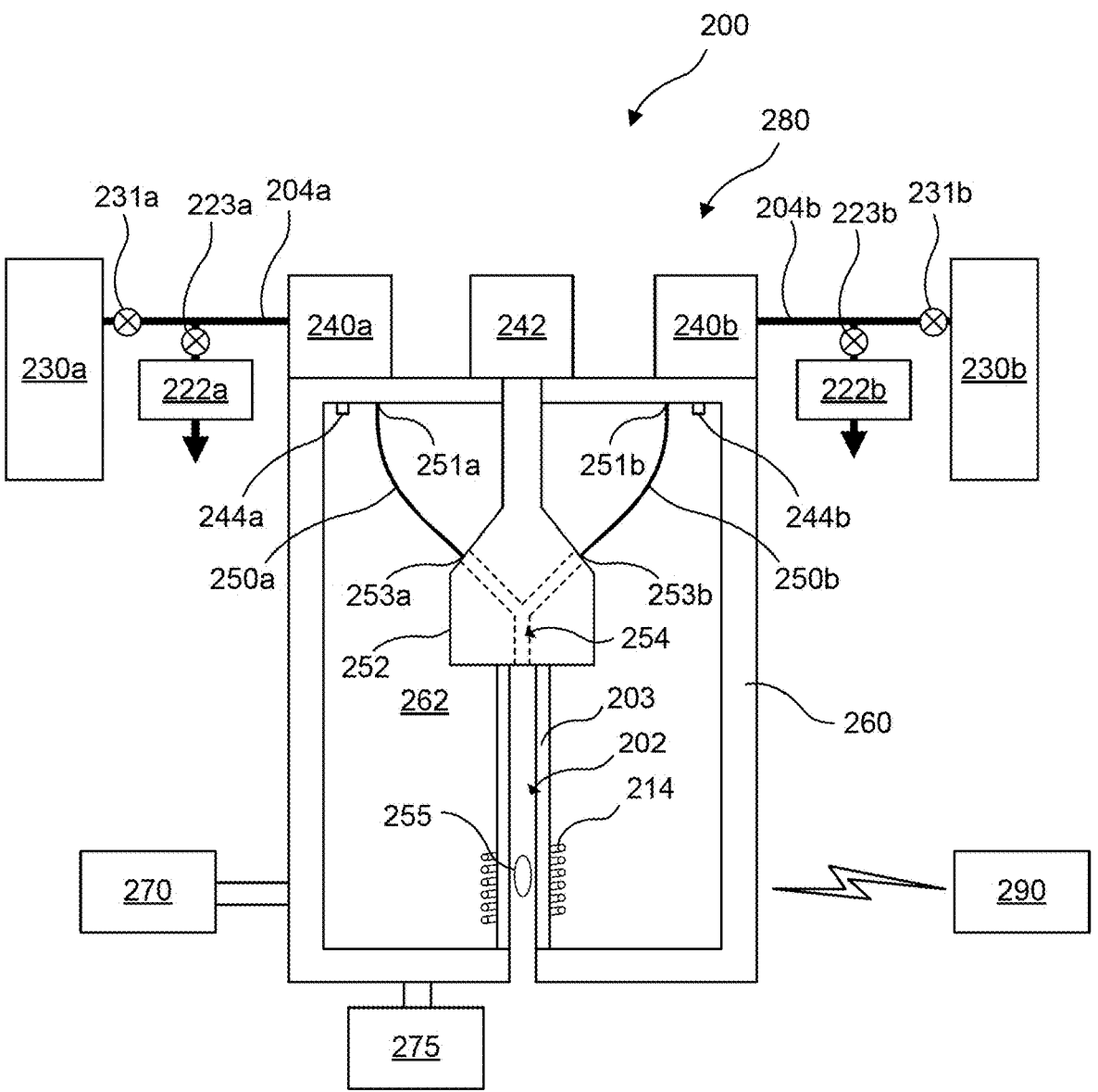
FIG. 2A depicts a simplified cross-sectional view of an example charged particle system according to an embodiment of the disclosure.
Figure 2B:
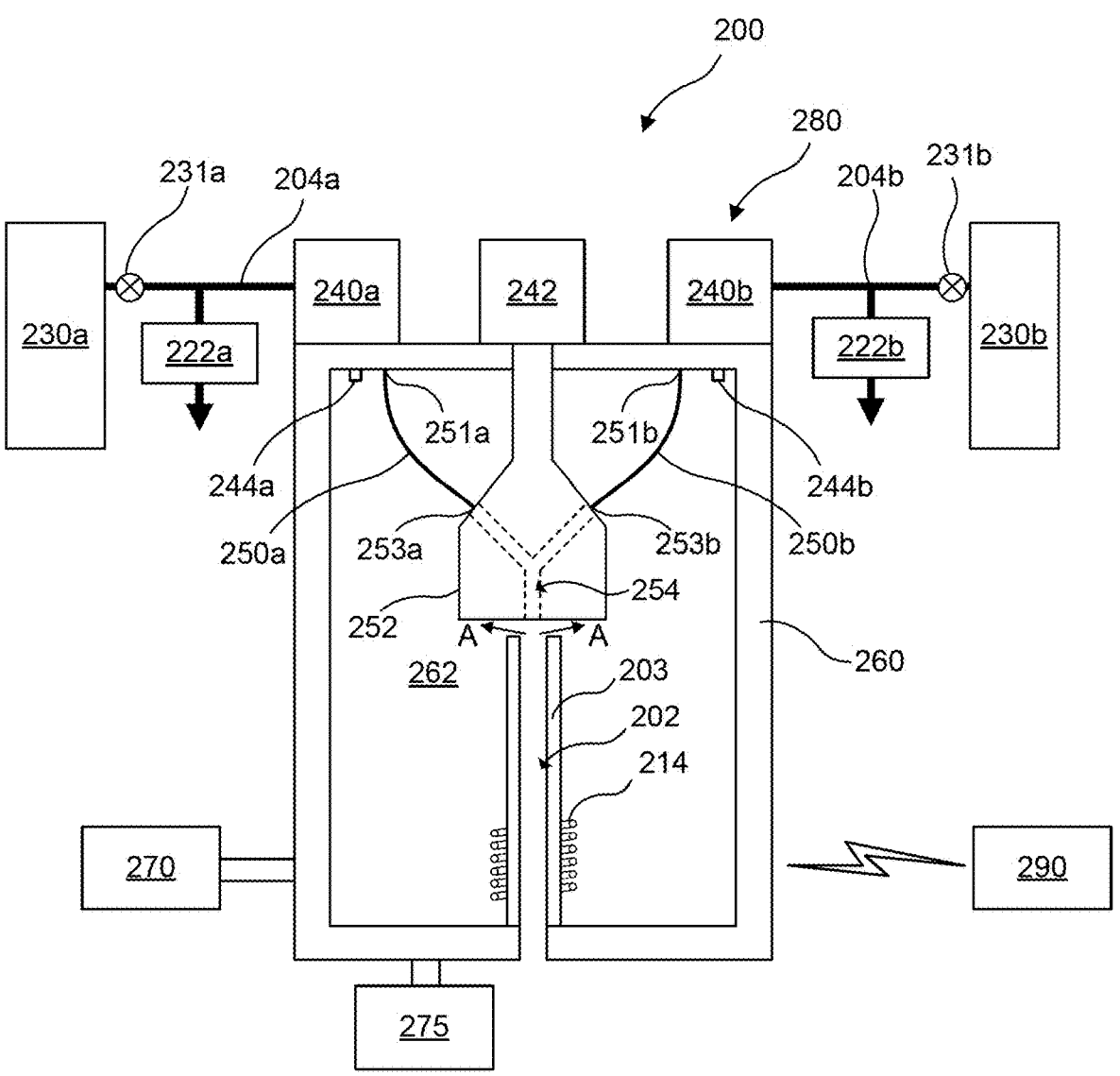
FIG. 2B depicts the charged particle system of FIG. 2A evacuating gas from the plasma source chamber according to an embodiment of the disclosure.

These issues are addressed by the described plasma source system with individual controllers along with different methods of introducing gas mixtures into, and evacuating gas mixtures out of, a plasma source chamber of the plasma source system. For example, FIGS. 2A and 2B depict an example charged particle system 200, including a plasma source system 280 and a computer system 290 (similar to the computer system 810, shown in FIG. 8) in communications with the plasma source system 280 to provide instructions to operate the plasma source system 280. As noted above, additional details regarding the charged particle system 200, such as the focusing column and sample chamber, are not shown. It is understood that features ending in like reference numerals as features discussed above are similar, except as noted below.

The plasma source system 280 includes a first gas reservoir 230*a* and a second gas reservoir 230*b* fluidly coupled to a chamber body 260 through respective gas valves 231*a*, 231*b* (e.g., a pressure regulator, bypass valve, or the like), gas supply lines 204*a*, 204*b* and controllers 240*a*, 240*b*. The chamber body 260 defines an interior volume 262 that houses a first capillary constriction 250*a*, a second capillary constriction 250*b*, a bypass manifold 252 defining a bypass chamber 254, a plasma source tube 203 defining a plasma source chamber 202, and antenna coils 214. Each of the gas reservoirs 230*a*, 230*b* may include a corresponding gas supply line 204*a*, 204*b*, pump valves 223*a*, 223*b*, pump 222*a*, 222*b*, gas valves 231*a*, 231*b*, controller 240*a*, 240*b*, and capillary constriction 250*a*, 250*b*. Although only two gas reservoirs 230*a*, 230*b* are depicted, in other embodiments, there may be any number of gas reservoirs, such as one, three, four, five, or the like. In these examples, each of the gas reservoirs may include a corresponding gas supply line, pump, gas valve, controller, and capillary constriction. The respective gas reservoirs 230*a*, 230*b*, gas supply lines 204*a*, 204*b*, pump valves 223*a*, 223*b*, pumps 222*a*, 222*b*, controllers 240*a*, 240*b*, and capillary constrictions 250*a*, 250*b* may be fluidly coupled to each other such that the gases may flow from the gas reservoirs 230*a*, 230*b* through the gas supply lines 204*a*, 204*b*, the controllers 240*a*, 240*b*, and the capillary constrictions 250*a*, 250*b* to be mixed in the plasma source chamber 202.

FIG. 2A depicts the gases flowing downstream from the gas reservoirs 230*a*, 230*b* through the gas supply lines 204*a*, 204*b*, controllers 240*a*, 240*b*, capillary constrictions 250*a*, 250*b*, the bypass chamber 254, and into the plasma source chamber 202 to generate a plasma 255. The ion species ratio of the ion beam extracted from the plasma 255 may be measured by a measuring unit 275 (e.g., a residual gas analyzer, mass spectrometer, or the like) positioned on the sample, in the ion beam column, or the like. FIG. 2B depicts the evacuation of the gases used to generate the plasma 255 by instructing a bypass actuator 242 to move the bypass manifold 252, as described further below. As discussed above, in other examples of plasma sources, controlling the pressure and gas flow rate for a more precise gas mixture composition can be difficult, inconsistent, and wasteful. The capillary constrictions 250*a*, 250*b* and the controllers 240*a*, 240*b* address these issues.

The controllers 240*a*, 240*b* may be fluidly coupled between the gas supply lines 204*a*, 204*b* and the capillary constrictions 250*a*, 250*b* such that the controllers 240*a*, 240*b* control the flow rate of gas entering the capillary constrictions 250*a*, 250*b* from the gas supply lines 204*a*, 204*b*. This, in turn, may control the flow rate of gas entering the bypass chamber 254 and then into the plasma source chamber 202. For example, the controllers 240*a*, 240*b* may include a variable outlet pressure valve capable of controlling a pressure, and providing a variable flow rate, from the gas supply lines 204*a*, 204*b* to the capillary constrictions 250*a*, 250*b*. In this manner, the controllers 240*a*, 240*b* may adjust a partial pressure of each gas species in the gas mixture used to generate the plasma 255 to adjust the composition of the gas mixture. The controllers 240*a*, 240*b* allow for the gas mixture to be dynamically adjusted (e.g., adjusted in real-time while the ion is being extracted) without requiring the evacuation of the gas mixture. The controllers 240*a*, 240*b* may also include a pressure sensor to detect a gas pressure of the gas supply lines 204*a*, 204*b* and/or the capillary constrictions 250*a*, 250*b*. The controllers 240*a*, 240*b* may be instructed to release gas into the capillary constrictions 250*a*, 250*b* at least in part due to the pressure measurements detected by the pressure sensor.

In some embodiments, the controllers 240*a*, 240*b* may control a pressure both upstream and downstream of the controllers 240*a*, 240*b*. For example, the controllers 240*a*, 240*b* may control a pressure downstream of the controllers 240*a*, 240*b* by controlling the relief valve to allow for the gas to flow from the gas supply lines 204*a*, 204*b* into the capillary constrictions 250*a*, 250*b*. The controllers 240*a*, 240*b* may control a pressure upstream of the controllers 240*a*, 240*b* by controlling relief port valves 244*a*, 244*b* included in the controllers 240*a*, 240*b*. The relief port valves 244*a*, 244*b* may be in fluid communication with a vacuum source (e.g., the interior volume 262, as discussed below) to allow for gas from the gas supply lines 204*a*, 204*b* and capillary constrictions 250*a*, 250*b* to flow through the relief port valves 244*a*, 244*b* and toward the vacuum source. For example, the relief port valves 244*a*, 244*b* may allow for gas in the gas supply lines 204*a*, 204*b* to flow downstream through the relief port valves 244*a*, 244*b* and evacuate into the vacuum source, while the gas in the capillary constrictions 250*a*, 250*b* may flow upstream in the capillary constrictions 250*a*, 250*b* and through the relief port valves 244*a*, 244*b* and evacuate to the vacuum source.

The controllers 240*a*, 240*b* may control the relief port valves 244*a*, 244*b* such that the controllers 240*a*, 240*b* may evacuate gases in the gas supply lines 204*a*, 204*b*. In this manner, the gas in the gas supply lines 204*a*, 204*b* may be evacuated at one end by the controllers 240*a*, 240*b* and at the other end by the pumps 222*a*, 222*b* to expedite the gas evacuation of the gas supply lines 204*a*, 204*b*. Additionally or alternatively, the controllers 240*a*, 240*b* may control the opening of the relief port valves 244*a*, 244*b* to evacuate the gases in the capillary constrictions 250*a*, 250*b*. In this manner, gas in the capillary constrictions 250*a*, 250*b* may be evacuated in both a downstream and upstream direction to further expedite the gas evacuation of the capillary constrictions 250*a*, 250*b* without having to evacuate the gas in the gas supply lines 204*a*, 204*b*, as will be discussed further below. The controllers 240*a*, 240*b* can also control the relief port valves 244*a*, 244*b* to evacuate gases from both the supply lines 204*a*, 204*b* and the capillary constrictions 250*a*, 250*b* at the same time to expedite evacuation of all gases from the plasma source system 280.

Because the controllers 240*a*, 240*b* are fluidly coupled to the capillary constrictions 250*a*, 250*b* to individually control the flow rate of each gas species entering the gas mixture, the partial pressure of each gas from the gas reservoirs 230*a*, 230*b* can be more precisely controlled. Additionally, the capillary constrictions 250*a*, 250*b* may be distinct from each other to facilitate this increased precision by ensuring that each gas is delivered directly into the bypass chamber 254 at a particular pressure without being changed by the introduction of other gases. The capillary constrictions 250*a*, 250*b* may be distinct from each other where the gases in each of the capillary constrictions 250*a*, 250*b* do not interact with other gases until being mixed in the plasma source chamber 202. For example, the capillary constrictions 250a, 250b may be spaced apart from another. The capillary constrictions 250a, 250b may also be nonintersecting with each other. The capillary constrictions 250a, 250b may also be separated from each other. In this manner, the controllers 240a, 240b can be individually adjusted to allow for a particular gas flow rate of each gas to enter the bypass manifold 252, thus allowing for a more precise control of the pressure of each gas in the total pressure of the gas mixture.

Further, as each of the capillary constrictions 250a, 250b are distinct from each other, each of the controllers 240a, 240b can sense a pressure for each gas species in the corresponding gas supply lines 204a, 204b without the pressure of the other gas species potentially interfering with the pressure sensor in each controller 240a, 240b. In this manner, the controllers 240a, 240b can more accurately sense the pressure of each gas species in the gas supply lines 204a, 204b. In turn, these more accurate pressure measurements can allow for the controllers 240a, 240b to more accurately and precisely control the flow rate of gas entering the capillary constrictions 250a, 250b. This may be particularly beneficial in comparison to other embodiments where the pressure of other gases may interfere with the pressure sensing of the controllers (e.g., if the controllers were positioned along a same gas supply line, similar to the valves 131a, 131b, 131c, 131d shown in FIG. 1). In such an embodiment, the pressure from each of the gases in the supply line would be mixed together such that the controllers would be unable to sense the partial pressure of each gas species. This embodiment would be unable to accurately control for the partial pressure of each gas species in a gas mixture and, therefore, be unable to precisely control the composition of the gas mixture. This issue may be compounded in embodiments using a constriction as the volume of gas supply line between the controllers and the constriction may add to the difficulty in controlling the gas mixture composition as the actual pressure of each gas downstream of the volume may be less likely to represent the sensed pressure of each gas upstream of the volume (e.g., where the controller is positioned).

On the other hand, the controllers 240a, 240b being directly coupled to the corresponding capillary constrictions 250a, 250b before the gas is mixed in the plasma source chamber 202 can more precisely control the composition of the gas mixture. This may be beneficial to optimize milling and polishing operations by making small adjustments to the gas mixture composition specific to each layer of sample material. This may also allow for milling processes on specific materials to be accelerated or decelerated as desired. Further this dynamic adjustment of the gas mixture may minimize gas shadowing effects by controlling for the volatilization and redeposition of sputtered materials.

The controllers 240a, 240b can individually release gas independently of each other. For example, even in a situation in which the gas supply lines 204a, 204b include a same pressure, the first controller 240a can release gas from the first gas supply line 204a downstream into the first capillary constriction 250a at a first flow rate different than a second flow rate that the second controller 240b releases gas from the second gas supply line 204b into the second capillary constriction 250b. In this manner, the gases from the gas reservoirs 230a, 230b may be simultaneously or cyclically released into the bypass chamber 254.

The controllers 240a, 240b may simultaneously release the gases by releasing the gases into the corresponding capillary constrictions 250a, 250b at a flow rate greater than zero. This may include releasing the gases from each of the gas supply lines 204a, 204b into the capillary constrictions 250a, 250b at a same flow rate or at different flow rates. The controllers 240a, 240b may release gas at a constant flow rate such that the composition of the gas mixture is held constant for a period of time (e.g., when milling through a layer of sample material). The controllers 240a, 240b may additionally or alternatively release gas at a variable rate such that the composition of the gas mixture changes over a period of time (e.g., when milling through a transition in sample material).

The controllers 240a, 240b may cyclically release the gases by setting a first flow rate of a first gas to zero (e.g., stopping the downstream flow of the gas) and setting a second flow rate of a second gas to be non-zero for a first period of time. After the first period of time, the controllers 240a, 240b may then set the first flow rate to be non-zero and may set the second flow rate to be zero for a second period of time. The controllers 240a, 240b may thus cyclically release the gases by cycling at least one downstream gas flow rate to zero in this manner. In some embodiments, where there are more than two gas reservoirs, the controllers may release some of the gases in tandem while also cycling other gases out. For example, the controllers may release two or more gases at a similar or different non-zero flow rate while setting one or more of the other gases to a flow rate of zero for a period of time, and cycle at least one gas to have a flow rate of zero for each period of time.

The controllers 240a, 240b and capillary constrictions 250a, 250b may be fluidly coupled while at least one of the controllers 240a, 240b and capillary constrictions 250a, 250b are directly coupled to the chamber body 260. The chamber body 260 may define an opening adjacent the controllers 240a, 240b so that the capillary constrictions 250a, 250b can be fluidly coupled to the controllers 240a, 240b without being directly coupled to each other. For example, a portion of the controllers 240a, 240b may extend through the chamber body 260 to fluidly couple the capillary constrictions 250a, 250b to the controllers 240a, 240b. In another example, the capillary constrictions 250a, 250b may extend through the chamber body 260 to fluidly couple the capillary constrictions 250a, 250b to the controllers 240a, 240b. In a yet different example, the capillary constrictions 250a, 250b and the controllers 240a, 240b may be coupled to opposite sides of the chamber body 260 but may be fluidly coupled to each other through the opening in the chamber body 260.

The controllers 240a, 240b may release the gas from the gas supply lines 204a, 204b into the capillary constrictions 250a, 250b at any flow rate between a maximum flow rate of releasing the gas into the capillary constrictions 250a, 250b at a pressure equal to the pressure in the gas supply lines 204a, 204b to a minimum flow rate of not releasing any gas into the capillary constrictions 250a, 250b. In this manner, the controllers 240a, 240b can act as a stop in the gas flow path between the gas supply lines 204a, 204b and the capillary constrictions 250a, 250b such that the gases in the gas supply lines 204a, 204b are fluidly isolated from the capillary constrictions 250a, 250b. This allows for the pressure in the gas supply lines 204a, 204b to be held at a constant pressure and the pressure in the capillary constrictions 250a, 250b to be variable. As will be described further below, this may be beneficial when evacuating the gas mixture as only the gas in the capillary constrictions 250a, 250b would require evacuation rather than the entire gas supply lines 204a, 204b (as in the gas supply line 104 in FIG. 1).

The capillary constrictions 250a, 250b may each be a tube having a respective first end 251a, 251b coupled to the chamber body 260 and a respective second end 253a, 253b coupled to the bypass manifold 252. The diameter of the capillary constrictions 250a, 250b may be sized to improve their high voltage standoff and, therefore, minimize any plasma creepage within the capillary constrictions 250a, 250b and minimize arcing. For example, the diameter may be sized to reduce the mean free path length of the gas in the plasma cell. This may help prevent a high voltage breakdown by gradually dropping the pressure across the capillary constriction to a level that withstands Paschen breakdown due to the high electric field potential in the plasma region. The capillary constrictions 250a, 250b may be made of an electrically insulating material (e.g., plastic, rubber, or the like) to further protect against arcing. The internal surface of the capillary constrictions 250a, 250b that defines the internal diameter may also include a fused silica lining to resist carbonizing due to arcing as well as resisting outgassing. The length may be sized to provide a sufficient flow rate to sustain plasma cell pressure and allow for adjustability of the gas mixture.

For example, the capillary constrictions 250a, 250b may have a diameter of about 100 μm, such as less than about 75 μm, less than about 50 μm, or less than about 25 μm. As this diameter may be more consistent than a constriction defined in a tube of other plasma source systems, delivery of gas through the capillary constrictions 250a, 250b may be more consistent and repeatable. The capillary constrictions 250a, 250b may have a length of between about 50 and 280 mm, such as between about 75 mm and 175 mm, or such as between about 100 and 150 mm. This length may allow for the components sensitive to plasma arcing (e.g., the controllers 240a, 240b, ground enclosures, or other structural components) to be positioned sufficiently further away from the region of high field potential to prevent arcing by proximity. In a preferred embodiment, the capillary constrictions 250a, 250b may have a preferred diameter of about 50 μm and a length of about 150 mm. The capillary constrictions 250a, 250b may have similar dimensions, however, in other embodiments, each of the capillary constrictions may have different dimensions. In a further alternative, where there are three or more capillary constrictions, only some capillary constrictions may have similar dimensions (e.g., two out of three capillary constrictions have similar dimensions or the like). These dimensions can minimize the pressure drop across the capillary constrictions 250a, 250b (e.g., around 100-1000 mbar) compared to the larger pressure drops (e.g., around 2-3 bar) when using a constriction in other plasma source systems, thus allowing for easier control of the pressure and flow rate of gas entering the capillary constrictions 250a, 250b than the gas entering the constriction in those other systems.

As will be discussed further below, the small size of the capillary constrictions 250a, 250b, and thereby the small volume of gas that each capillary constriction 250 can hold, may decrease gas waste when evacuating gas from the plasma source system 280. Further, the capillary constrictions 250a, 250b may be cheaper than other components used to deliver gas, such as the tube 108 in FIG. 1, as the capillary constrictions 250a, 250b may have a less complex geometry (e.g., not including a change in diameter along its length, such as constriction 110 in FIG. 1) and may use cheaper materials (e.g., using a plastic material rather than metal). However, in other embodiments, the capillary constrictions may have a non-uniform diameter along its length and may use any type of material, including glass (e.g., silica), metal, or the like.

The chamber body 260 may be in fluid communication with a vacuum source (e.g., a vacuum pump 270) such that the interior volume 262 is under vacuum. However, in other embodiments, the interior volume 262 may not be in fluid communication with a vacuum source and, instead, a vacuum source may be in fluid communication with other components of the charged particle system, such as the bypass chamber and/or the controllers. In this manner, as discussed further below, gas may be evacuated through the bypass chamber and/or the controllers. The bypass manifold 252 may be a structure that defines the bypass chamber 254 such that, when the bypass manifold 252 and the plasma source tube 203 are coupled together, as shown in FIG. 2A, the bypass manifold 252 may fluidly isolate the capillary constrictions 250a, 250b, the bypass chamber 254, and the plasma source chamber 202 from the interior volume 262. In this manner, the gases in the capillary constrictions 250a, 250b, the bypass chamber 254, and the plasma source chamber 202 may be used to generate the plasma 255 without escaping into the interior volume 262. In some embodiments, a controller may be fluidly coupled between the bypass chamber and the plasma source chamber. This may be beneficial to control the gas flow from entering the plasma source until desired. For example, this controller may stop gas from entering the plasma source until all the gases are adequately mixed in the bypass chamber to form a homogenous gas mixture. Once the gas mixture is formed, the controller may release the gas mixture from the bypass chamber into the plasma source chamber.

As noted above, other plasma source systems typically require the gas in the entire system to be fully evacuated when switching gas species for use in the gas mixture (e.g., the pump 122 evacuating gas from all of the plasma source chamber 102, the tube 108, and the gas supply line 104 in FIG. 1). This is costly as wasting such gas is expensive. Additionally, evacuating the entire system takes an unnecessarily long time. The plasma source systems of the present disclosure address these issues by allowing for gas species to be changed by partially evacuating the system, resulting in considerably less gas wastage.

Gases from the plasma source system 280 can be partially evacuated by evacuating only the gases in the plasma source chamber 202, bypass chamber 254, and capillary constrictions 250a, 250b. Specifically, the bypass actuator 242 may be instructed to move the bypass manifold 252 from a first state shown in FIG. 2A to a second state shown in FIG. 2B by moving the bypass manifold 252 away from the plasma source tube 203. This allows the gases in the capillary constrictions 250a, 250b, the bypass chamber 254, and the plasma source chamber 202 to escape into the interior volume 262 along arrows A. The gases may then be evacuated from the charged particle system 200 by flowing to a vacuum source. It should be understood that the distance the bypass manifold 252 moves from the first state to the second state are for illustrative purposes only and that the bypass manifold 252 may move any distance between states to allow for gas evacuation. In other embodiments, where the bypass chamber and/or the controllers are in fluid communication with the vacuum source rather than the interior volume, the gas may be evacuated through the bypass chamber and/or the controllers to the vacuum source.

As the gases from the gas supply lines 204a, 204b are not required to be evacuated during this gas species change, the gases in the gas supply lines 204a, 204b are not unnecessarily wasted. Further, this partial evacuation saves time by not having to evacuate the gas supply lines 204*a*, 204*b* in order to change gas species. Even further, because the capillary constrictions 250*a*, 250*b* can be significantly smaller (e.g., between about 50,000 to 200,000 times smaller) than gas supply lines used in other plasma source systems (e.g., than the gas supply line 104 in FIG. 1), even less gas is required to be evacuated, thus saving even more time and further minimizing gas waste.

Additionally, changing gas species may be faster overall, as shown in an example where there are more than two gas reservoirs, and one or more gas species are changed out. In this example, the gas valves may release three or more gas reservoirs to pressurize their respective gas supply lines, however, only a first controller releases a first gas species of a first gas reservoir into a first capillary constriction and a second controller releases a second gas species of a second gas reservoir into a second capillary constriction to form a first gas mixture. Later on in the process, it may be desirable to change the first gas species with a third gas species that has not yet been introduced into the plasma source chamber but which has already been released into a corresponding gas supply line. The first and second gas species may be evacuated out of their respective capillary constrictions without evacuating the gas supply lines of all the gas reservoirs, as noted above. Then the second controller may release the second gas species back into the second capillary constriction while a third controller may release a third gas species into a third capillary constriction to form a second gas mixture without the first gas species. This process highlights a further benefit of the capillary constrictions and controllers because, not only is the evacuation of the first and second gas species faster and less wasteful, as discussed above, but the introduction of the third gas species is also faster. Specifically, because the third gas supply line corresponding to the third gas reservoir had already been pressurized and ready to be introduced into the third capillary constriction (and, therefore, into the bypass chamber and plasma source chamber), less time was required to form this second gas mixture compared to other plasma source systems that requires the entire gas supply to be evacuated and re-pressured when changing gas species.

The gases in the capillary constrictions 250*a*, 250*b* can be more expediently evacuated without wasting the gases in the gas supply lines 204*a*, 204*b* by utilizing the relief port valves 244*a*, 244*b* defined in the controllers 240*a*, 240*b*. Specifically, the controllers 240*a*, 240*b* may control the relief port valves 244*a*, 244*b* to evacuate the gases in the capillary constrictions 250*a*, 250*b* from the first ends 251*a*, 251*b* at the same time gases are evacuated from the second ends 253*a*, 253*b* through the bypass chamber 254 into the interior volume 262. As the controllers 240*a*, 240*b* can control the relief port valves 244*a*, 244*b* to allow for the evacuation of the gases in the capillary constrictions 250*a*, 250*b* without affecting the gases in the gas supply lines 204*a*, 204*b*, the gases in the gas supply lines 204*a*, 204*b* are not wasted by using the relief port valves 244*a*, 244*b* to evacuate gases in the capillary constrictions 250*a*, 250*b*.

Where the entire plasma source system 280 is being evacuated (e.g., all the gas supply lines 204*a*, 204*b*, the capillary constrictions 250*a*, 250*b*, the bypass chamber 254, and the plasma source chamber 202), the charged particle system 200 may evacuate the gases faster than other plasma source systems. Using the relief port valves 244*a*, 244*b*, the gases in the gas supply lines 204*a*, 204*b* may be evacuated from two ends: from one end by the pumps 222*a*, 222*b* and the other end by the corresponding relief port valves 244*a*,

244*b* in the controllers 240*a*, 240*b*. In this manner, the gas supply lines 204*a*, 204*b* may be more expediently evacuated compared to other plasma source systems that evacuate gas supply lines only using a pump (e.g., the pump 122 in FIG. 1). In some embodiments, the gas in the gas supply lines may be evacuated without evacuating the gas in the capillary constrictions, bypass chamber, and plasma source chamber.

Figure 3:
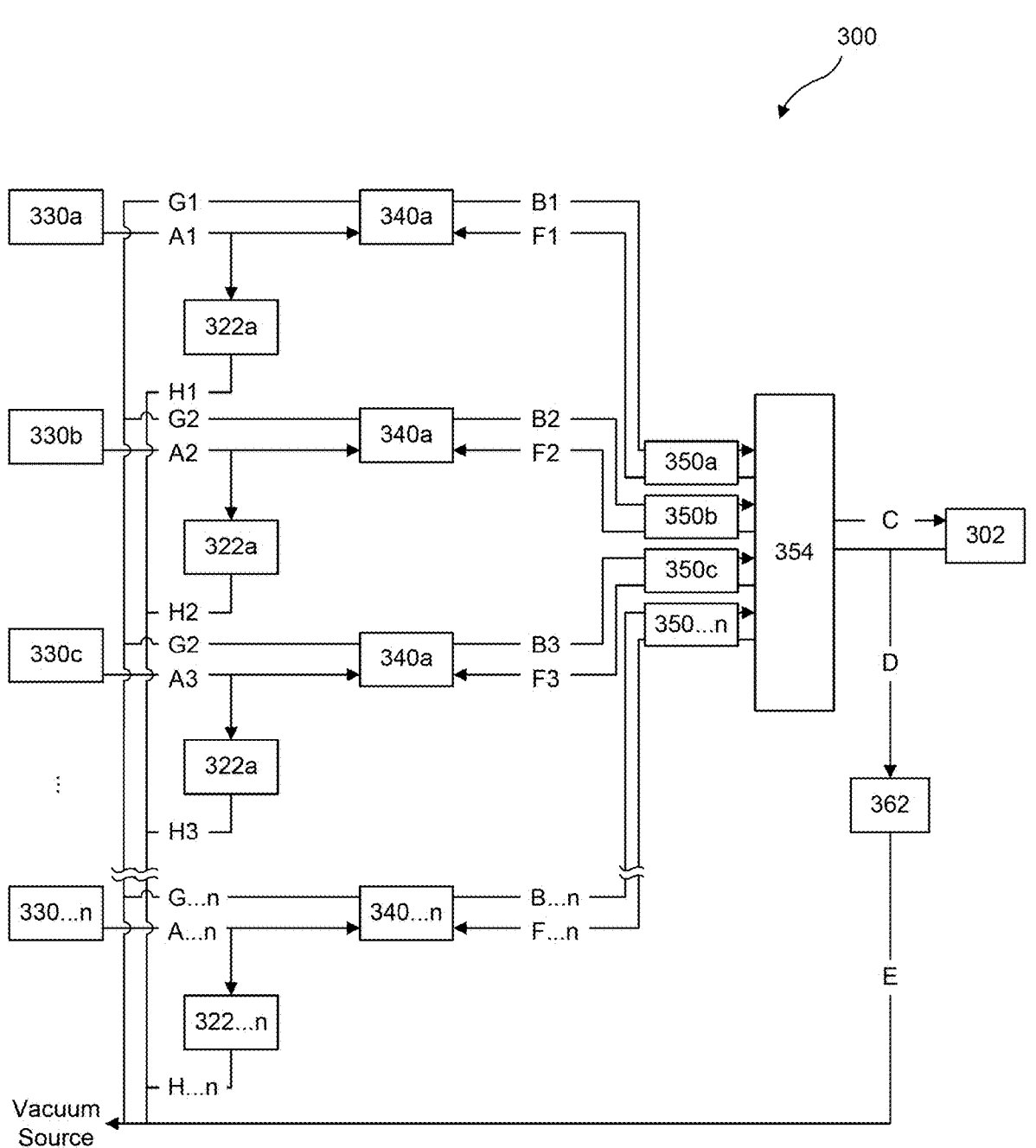
FIG. 3 depicts a diagram showing gas flow paths of a plasma source system according to an embodiment of the disclosure.

FIG. 3 depicts a diagram 300 showing gas flow paths of a plasma source system. It is understood that features ending in like reference numerals as features discussed above are similar, except as noted below. As shown, the plasma source can have any number of gas reservoirs 330*a*, 330*b*, 330*c*, 330 . . . n. The following description will focus on the gas flow path of a first gas from a first gas reservoir 330*a*, however, it is understood that the gas flow path of the other gases from the other gas reservoirs 330*b*, 330*c*, 330 . . . n may follow a correspondingly similar path as shown in FIG. 3.

When introducing gas into the plasma source chamber 302, the first gas from the first gas reservoir 330*a* may be released (e.g., via a gas valve, such as the valve 231*a* in FIGS. 2A and 2B) to enter a corresponding gas supply line (e.g., the gas supply line 204*a*). The first gas may flow along the gas supply line along a first flow path A1 to both the first controller 340*a* and the first pump 322*a*. At this point, the first pump 322*a* may not be activated and, therefore, may not release the first gas to a vacuum source. The first controller 340*a* may be opened to release the first gas into a capillary constriction 350*a* to the bypass chamber 354 via a second gas flow path B1. This first gas may then flow from the bypass chamber 354 along a third gas flow path C into the plasma source chamber 302 to be mixed with one or more other gases, if any, from the other gas reservoirs 330*b*, 330*c*, 330 . . . n to form a gas mixture. This gas mixture may then be used in generating a plasma and ion beam extraction.

When evacuating only the gas in the capillary constriction 350*a*, the bypass chamber 354, and the plasma source chamber 302, a bypass actuator (e.g., the bypass actuator 242) may be instructed to move the bypass manifold (e.g., the bypass manifold 252) away from the plasma source tube (e.g., the plasma source tube 203) such that the gases in the capillary constriction 350*a*, the bypass chamber 354, and the plasma source chamber 302 flow into the interior volume 362 along a fourth flow path D. These gases may then flow toward the vacuum source along a fifth flow path E. These gases may also be evacuated from the other end of the capillary constriction 350*a* when the controller 340*a* opens the relief port valve (e.g., the relief port valve 244*a* in FIGS. 2A and 2B) to evacuate the gases through the capillary constriction 350*a* along a sixth flow path F1. When evacuating the gas from the gas supply lines, the pump 322*a* may evacuate one end of the gas supply line such that the gas flows from the gas supply line along H1 to the vacuum source. The controller 340*a* may open the relief port valve to evacuate the gases from the other end of the gas supply line such that the gas flows along the gas supply line along G1 to the vacuum source.

FIGS. 4, 5, 6, and 7 illustrate example flow diagrams showing respective processes 400, 500, 600, and 700, as described herein. The processes 400, 500, 600, and 700 are illustrated as logical flow diagrams, each operation of which represents a sequence of operations that can be implemented in hardware, computer instructions, or a combination thereof. For example, the operations may be computer instructions provided by a computer system, such as computer system 290 in FIGS. 2A and 2B, and computer system 810 in FIG. 8. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be omitted or combined in any order and/or in parallel to implement the processes.

Additionally, some, any, or all of the processes may be performed under the control of one or more computer systems configured with executable instructions and may be implemented as code (e.g., executable instructions, one or more computer programs, or one or more applications) executing collectively on one or more processors, by hardware, or combinations thereof. As noted above, the code may be stored on a computer-readable storage medium, for example, in the form of a computer program comprising a plurality of instructions executable by one or more processors. The computer-readable storage medium is non-transitory.

Figure 4:
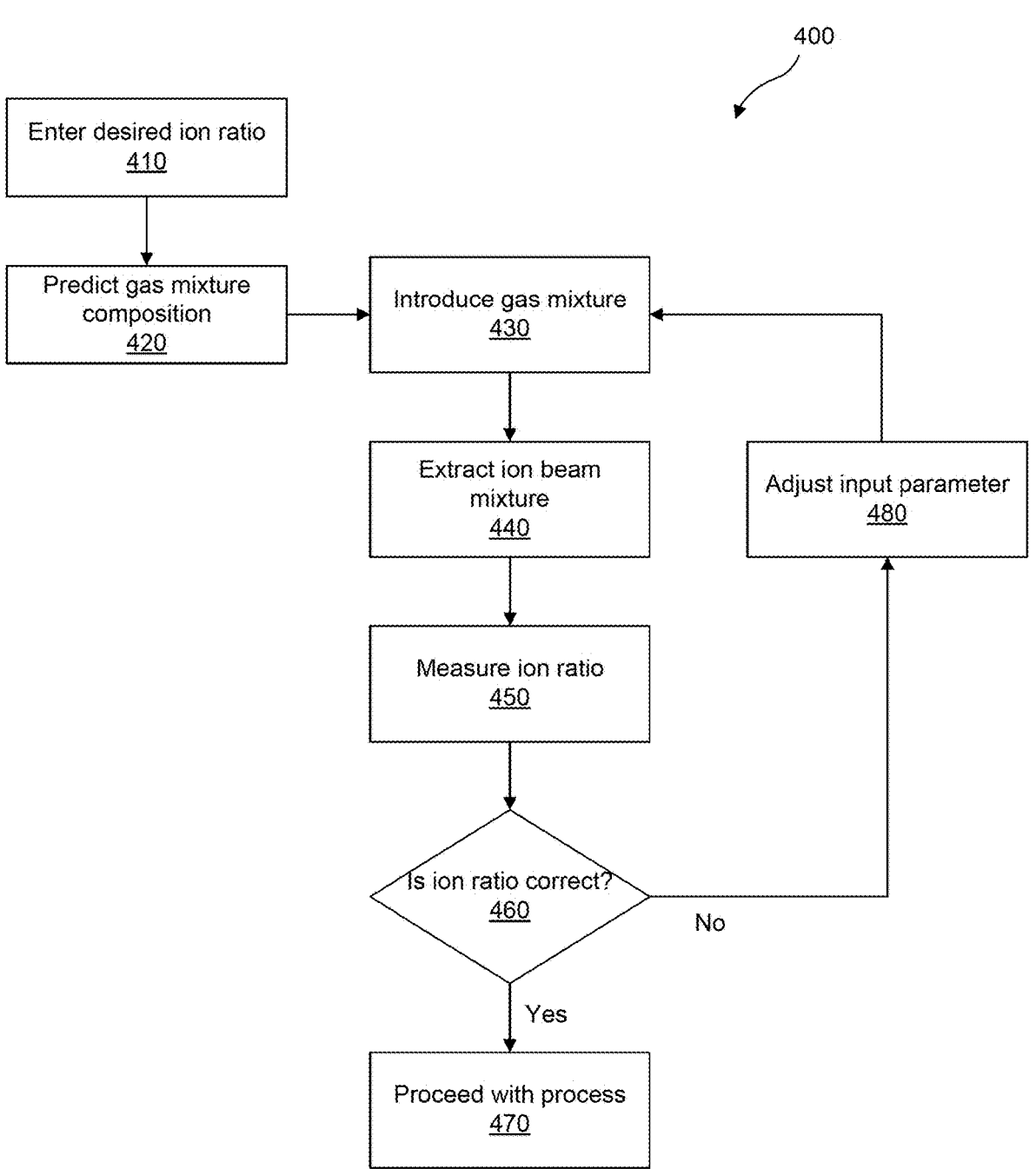
FIG. 4 depicts a flowchart for adjusting a ratio of gas species in a gas mixture using a plasma source system according to an embodiment of the disclosure.

FIG. 4 depicts an example flowchart showing a process 400 for adjusting a ratio of gas species in a gas mixture using a plasma source. It is understood that features ending in like reference numerals as features discussed above are similar, except as noted below. As discussed above, any of the steps in this process may be instructions provided by a computer system. This adjustment can be performed in real-time or prior to generating the plasma. Turning to Step 410, a desired ion ratio may be provided to a computer system (e.g., computer system 290). For example, a user may desire an ion ratio of 70% oxygen and 30% xenon to mill a particular portion of a sample. Turning to Step 420, the computer system may predict a gas mixture composition for use with providing this desired ion ratio. For example, the computer system may predict that a gas mixture of 80% oxygen and 20% xenon can be used to achieve this desired ion ratio. Note that a selected mixture ratio of gases does not necessarily translate to the same mixture ratio of ions due to multiple factors including physical and chemical effects within the chamber (e.g., RF power, temperature in the system, ionization efficiency of each gas, total pressure in the plasma chamber, production of both atomic and molecular species such as $O+$ and $O_2+$, or chemical interactions between gases or between gas and system components). In some examples, different systems may give slightly different ion mixture ratios from a same gas mixture input.

This prediction may be based on a prediction model trained using machine learning techniques, such as hidden Markov models, convolutional neural networks, polynomial regressions, and cluster analysis. Training the prediction model may include using a variety of different optimization techniques to optimize a loss function so that the address risk model output closely tracks the actual fraudulent behavior of the training set. Such optimization techniques can include gradient descent, backpropagation, conjugate gradient, other gradient techniques, or hessian techniques, such as Newton methods. The loss function can be a difference of the measured ion ratio and the predicted ion ratio at one or more points in time. The prediction model may be a machine learning model trained using large sets of data that include input parameters (e.g., gas mixture compositions, RF power, total pressure of the gas mixture, or the like) and resulting ion ratios. Accordingly, the prediction model may find patterns between a gas mixture and ion ratio such that the prediction model may output a gas mixture composition that is predicted to generate a desired ion ratio. Alternatively, the prediction model may output a predicted ion ratio that may result from a certain gas mixture. In other embodiments, the predictions may be based on an estimate table which is pre-populated with estimated gas mixtures that would generate estimated ion gas ratios. In some embodiments, the estimate table is particular to a specific system as each system may produce different ion ratio outputs due to subtle differences in plasma production based on each hardware implementation.

A plasma source system may generate this predicted gas mixture. For example, turning to FIG. 2A, the controllers 240a, 240b may introduce at least one of the gas species from each of the gas reservoirs 230a, 230b into the corresponding capillary constrictions 250a, 250b such that each gas species may have a partial pressure within the plasma source chamber 202 to form the predicted gas mixture. Turning back to FIG. 4, at Step 430, this predicted gas mixture may be introduced into the plasma source chamber 202 in a plasma source tube 203. Turning to Step 440, the gas mixture may be ionized to extract an ion beam from the gas mixture. Turning to Step 450, the ion ratio may be measured by a measuring unit (e.g., the measuring unit 275 in FIGS. 2A and 2B). Further detail regarding measurements of this ion ratio may be found in U.S. Pat. No. 10,763,079, the contents of which are hereby incorporated by reference in its entirety. The ion ratio may be continuously measured (e.g., once every millisecond, 1 second, 5 seconds, 10 seconds, 1 minute, or the like) to provide data regarding the measure ion ratio as the ion beam mills the sample. In this manner, data regarding the measured ion ratio may be continuously provided to the computer system as the ion beam mills through the various layers of the sample as well as when adjustments are made to the ion beam to adjust the ion ratio. However, in other embodiments, the ion ratio may be measured only when instructed to, such as when a user actively instructs the computer system to measure the ion ratio.

Turning to Step 460, the computer system may determine whether the ion ratio is correct. Specifically, the computer system may compare whether the measured ion ratio is substantially similar to the desired ion ratio entered in Step 410. The ion ratios may be substantially similar when the measured ion ratio value and the desired ion ratio value is within about a 20% deviation of each other, such as about a 10% deviation, such as about a 5% deviation, or being completely the same. If the ion ratio is substantially similar, the process (e.g., continued extraction of the ion beam to mill the sample) may be continued in Step 470.

If the measured ion ratio is not substantially similar, one or more input parameters may be adjusted to achieve the desired ion ratio in Step 480. For example, one or more gas species in the gas mixture may be adjusted to adjust the ion ratio. This may include adjusting a partial pressure of the particular gas species in the gas mixture, as described above, to change the composition of the gas mixture. In some embodiments, the entire gas species may be changed out with another gas species (or removed entirely from the gas mixture). The RF power may also be adjusted to change the ion ratio of the ion beam. The total pressure of the gas mixture in the plasma source chamber may be adjusted to affect a change in the ion ratio. In some embodiments, only one of these parameters may be adjusted, however, in other embodiments, multiple parameters may be adjusted (e.g., all parameters). Once the adjustments to the parameter(s) are made, the ion beam may be extracted, and the ion ratio measured again. The computer system may compare, whether the new ion ratio is substantially similar to the desired ion ratio. The computer may reiterate the above process as desired until the measured ion ratio is substantially similar to the desired ion ratio.

In either case, the measured ion ratio may be provided to the prediction model as additional data for use in updating the prediction model. For example, if the measured ion ratio is substantially similar to the desired ion ratio, the data regarding the measured ion ratio may confirm the accuracy of the prediction model for these particular gas species (e.g., confirming that the parameters predicted by the prediction model provide an ion ratio substantially similar to the desired ion ratio). This may result in minimal to no change to the prediction model. If the measured ion ratio is not substantially similar to the desired ion ratio, the data regarding the measured ion ratio may indicate that the prediction model for these particular gas species is not accurate. This may result in a change to the prediction model to account for this data such that future prediction models may provide a measured ion ratio that more accurately corresponds to the desired ion ratio (e.g., changing the parameters predicted by the prediction model to provide the desired ion ratio). The prediction model may be updated in real-time (e.g., updated as the data is provided to the prediction model) or may be updated at a later date (e.g., updated once enough data is gathered before a new version of the prediction model is provided to the computer system).

In some examples, changes in the prediction model can be used to perform system health monitoring. The computer system can keep a historical record (e.g., in a storage device or memory) of updates to the prediction model. When a system is in steady-state (i.e., healthy), the frequency of updates to the prediction model can be low as the measured ion ratio is often substantially similar to the desired ion ratio. However, when one or more components of the system begin to deteriorate, updates to the prediction model can become more frequent and/or the deviations between the measured ion ratio and the desired ion ratio can become larger. In some examples, the computer can analyze the historical record of updates to the prediction model to determine that the system may require servicing. Upon a determination the system requires servicing, the computer can notify a user to schedule a service or to check components of the system for deterioration using, e.g., a message on a graphical user interface on a monitor as described below in relation to FIG. 8.

Figure 5:
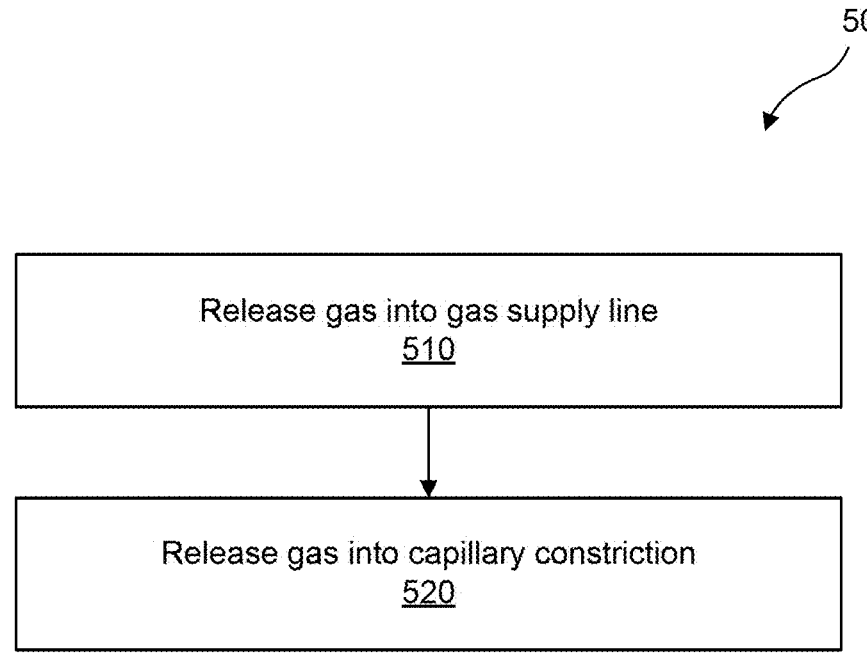
FIG. 5 depicts a flowchart showing a process for mixing a gas in a plasma source chamber according to an embodiment of the disclosure.

FIG. 5 depicts an example flowchart showing a process 500 for mixing a gas in a plasma source chamber. It is understood that features ending in like reference numerals as features discussed above are similar, except as noted below. For example, the flowchart in FIG. 5 may provide a more detailed process for Step 430 in the flowchart shown in FIG. 4. The flowchart for process 500 will be described with reference to the plasma source system 280 shown in FIG. 2A. As discussed above, any of the steps in this process may be instructions provided by a computer system. Turning to Step 510, the valves 231a, 231b may be opened to release gas from gas reservoirs 230a, 230b into the gas supply lines 204a, 204b until a desired pressure is reached (e.g., around 100-1000 mbar). Turning to Step 520, the controllers 240a, 240b may be opened to release a controlled rate or volume of each of the gases from the gas supply lines 204a, 204b into the capillary constrictions 250a, 250b. Each of the controllers 240a, 240b may release gases from the gas supply lines 204a, 204b into the capillary constrictions 250a, 250b to achieve a desired gas mixture and ion ratio in the plasma source chamber 202. Specifically, each of the controllers 240a, 240b may release each of the gas species at an individualized pressure such that each of the gas species will have a partial pressure within the gas mixture and, therefore, achieve a certain gas mixture composition. As noted above, this gas mixture in the plasma source chamber 202 will then be ionized to extract an ion beam for use in milling a sample.

Figure 6:
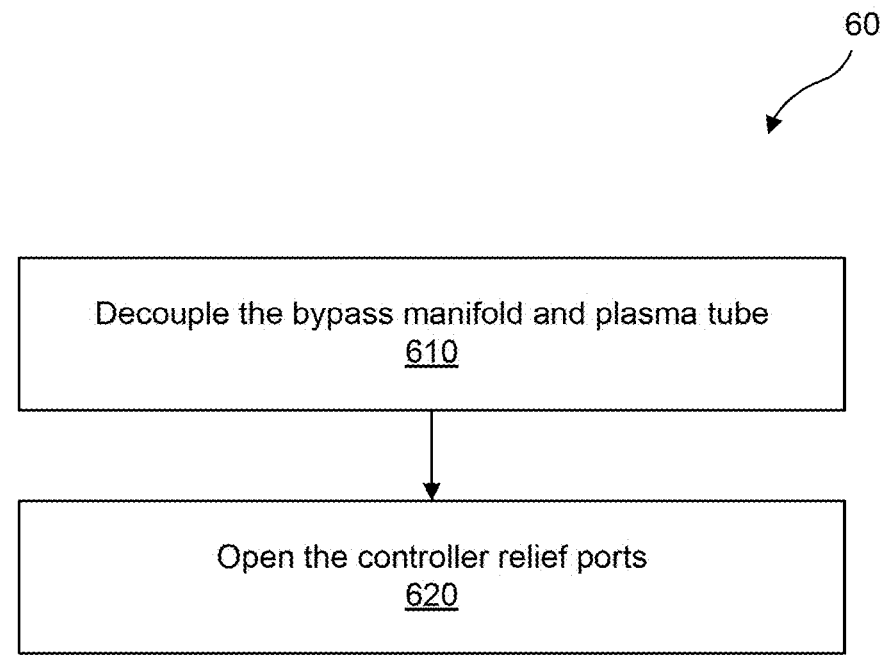
FIG. 6 depicts a flowchart showing a process for evacuating a gas from a plasma source chamber according to an embodiment of the disclosure.

FIG. 6 depicts an example flowchart showing a process 600 for evacuating a gas from a plasma source. It is understood that features ending in like reference numerals as features discussed above are similar, except as noted below. The flowchart in FIG. 6 will be described with reference to the plasma source system 280 shown in FIG. 2B. As discussed above, any of the steps in this process may be instructions provided by a computer system. Turning to Step 610, to partially evacuate the plasma source system 280, the bypass manifold 252 may be decoupled from the plasma source tube 203. In particular, the bypass actuator 242 may be actuated to move the bypass manifold 252 away from the plasma source tube 203. Decoupling the bypass manifold 252 and the plasma source tube 203 will allow the gases in the capillary constrictions 250a, 250b, the bypass chamber 254, and the plasma source chamber 202 to evacuate into the interior volume 262 which, in turn, will flow toward a vacuum source. This will partially evacuate the plasma source system 280 such that the gases in the capillary constrictions 250a, 250b, the bypass chamber 254, and the plasma source chamber 202 may be evacuated without evacuating the gases in the gas supply lines 204a, 204b as the controllers 240a, 240b fluidly isolate the gas supply lines 204a, 204b from the capillary constrictions 250a, 250b. In some embodiments, turning to Step 620, the controllers 240a, 240b may open the relief port valves 244a, 244b to allow for the gas to be evacuated from the capillary constrictions 250a, 250b at the first end 251a, 251b to more quickly evacuate the gases from the capillary constrictions 250a, 250b, the bypass chamber 254, and the plasma source chamber 202. The plasma source system 280 may be fully evacuated by also opening the pumps 222a, 222b to release the gases in the gas supply lines 204a, 204b at a first end and/or to open the relief port valves 244a, 244b of the controllers 240a, 240b to release the gases in the gas supply lines 204a, 204b at a second end.

Figure 7:
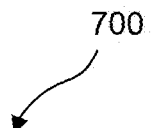
FIG. 7 depicts a flowchart showing a process for providing instructions to a plasma source system for mixing gas according to an embodiment of the disclosure.
Figure 7:
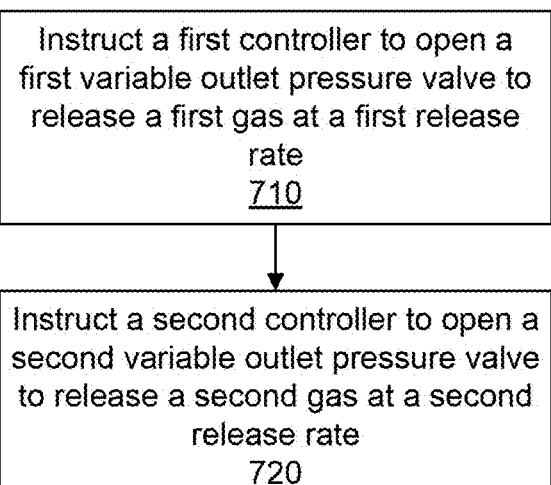

FIG. 7 depicts an example flowchart showing a process 500 for a computer system providing instructions to a plasma source for mixing gas. It is understood that features ending in like reference numerals as features discussed above are similar, except as noted below. The flowchart in FIG. 7 will be described with reference to the charged particle system 200 shown in FIG. 2A. Turning to Step 710, the computer system 290 may instruct a first controller 240a to open a first variable outlet pressure valve to release a first gas from a first gas reservoir 230a at a first flow rate into a plasma source chamber 202 via a first capillary constriction 250a. Turning to Step 720, the computer system 290 may instruct a second controller 240b to open a second variable outlet pressure valve to release a second gas from a second gas reservoir 230b at a second flow rate into a plasma source chamber 202 via a second capillary constriction 250b. The second capillary constriction 250b may be distinct from the first capillary constriction 250a. As noted above, the gases may flow from the capillary constrictions 250a, 250b into the bypass chamber 254 and then into the plasma source chamber 202 before being ionized. In this manner, the computer system 290 may facilitate the precise control of the partial pressures of each gas species from the gas reservoirs 230*a*, 230*b* to achieve a particular composition of the gas mixture.

To partially evacuate the charged particle system 200, the computer system 290 may also instruct the bypass actuator 242 to move the bypass manifold 252 away from the source tube 203 such that the first and second capillary constrictions 250*a*, 250*b*, the bypass chamber 254, and the plasma source chamber 202 are in fluid communication with the vacuum source. The computer system 290 may also open a first relief port valve 244*a* defined in the first controller 240*a* to fluidly couple the first capillary constriction 250*a* to the vacuum source and opening a second relief port valve 244*b* defined in the second controller 240*b* to fluidly couple the second capillary constriction 250*b* to the vacuum source.

Figure 8:
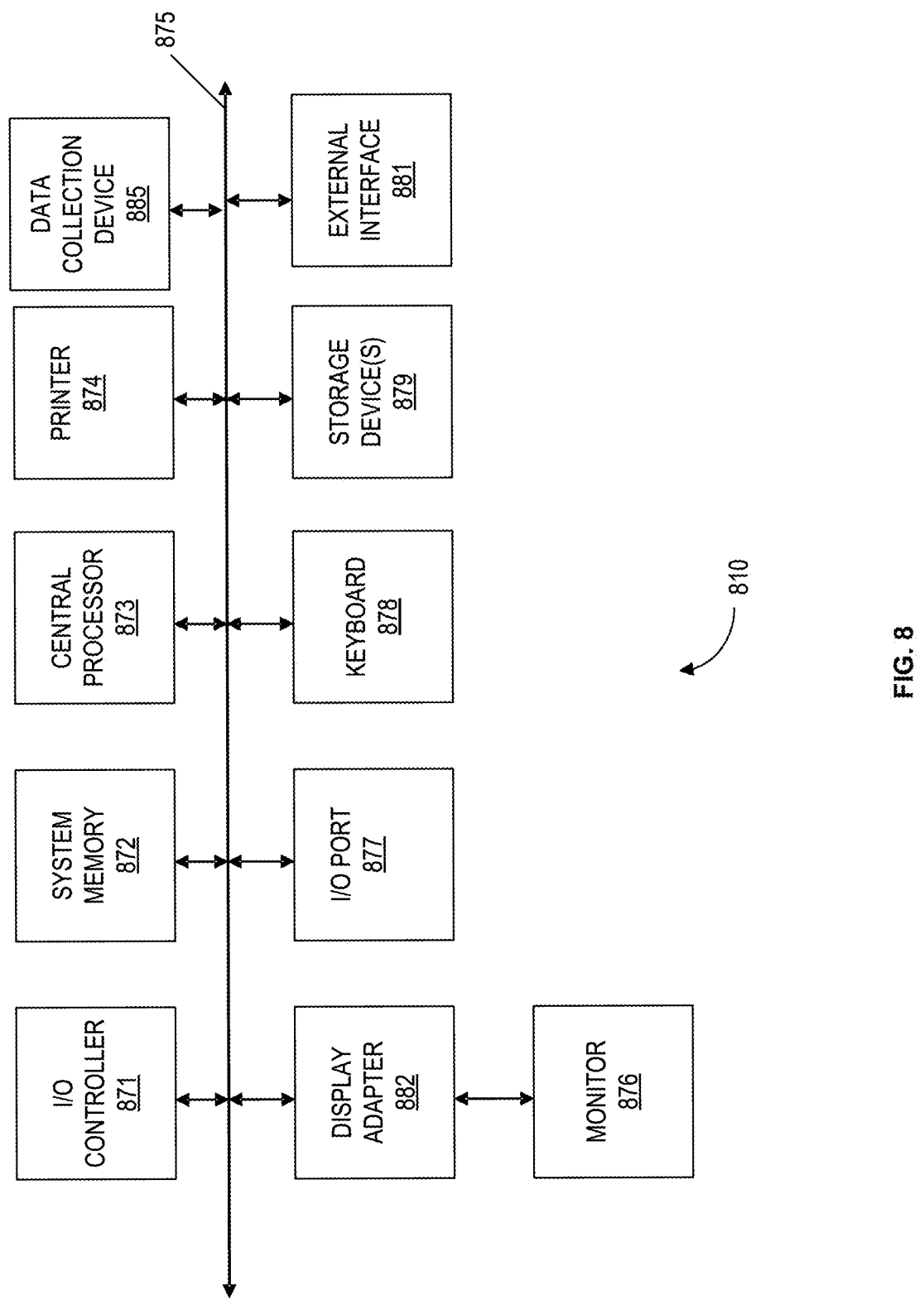
FIG. 8 depicts a block diagram of an example computer system usable with systems and methods according to embodiments of the present disclosure.

Any of the computer systems mentioned herein may utilize any suitable number of subsystems. Examples of such subsystems are shown in FIG. 8 in computer system 810. In some embodiments, a computer system includes a single computer apparatus, where the subsystems can be the components of the computer apparatus. In other embodiments, a computer system can include multiple computer apparatuses, each being a subsystem, with internal components. A computer system can include desktop and laptop computers, tablets, mobile phones and other mobile devices.

The subsystems shown in FIG. 8 are interconnected via a system bus 875. Additional subsystems such as a printer 874, keyboard 878, storage device(s) 879, monitor 876 (e.g., a display screen, such as an LED), which is coupled to display adapter 882, and others are shown. Peripherals and input/output (I/O) devices, which couple to I/O controller 871, can be connected to the computer system by any number of means known in the art such as input/output (I/O) port 877 (e.g., USB, FireWire®). For example, I/O port 877 or external interface 881 (e.g., Ethernet, Wi-Fi, etc.) can be used to connect computer system 810 to a wide area network such as the Internet, a mouse input device, or a scanner. The interconnection via system bus 875 allows the central processor 873 to communicate with each subsystem and to control the execution of a plurality of instructions from system memory 872 or the storage device(s) 879 (e.g., a fixed disk, such as a hard drive, or optical disk), as well as the exchange of information between subsystems. The system memory 872 and/or the storage device(s) 879 may embody a computer readable medium. Another subsystem is a data collection device 885, such as a camera, microphone, accelerometer, and the like. Any of the data mentioned herein can be output from one component to another component and can be output to the user.

A computer system can include a plurality of the same components or subsystems, e.g., connected together by external interface 881, by an internal interface, or via removable storage devices that can be connected and removed from one component to another component. In some embodiments, computer systems, subsystem, or apparatuses can communicate over a network. In such instances, one computer can be considered a client and another computer a server, where each can be part of a same computer system. A client and a server can each include multiple systems, subsystems, or components.

Aspects of embodiments can be implemented in the form of control logic using hardware circuitry (e.g., an application specific integrated circuit or field programmable gate array) and/or using computer software stored in a memory with a generally programmable processor in a modular or integrated manner, and thus a processor can include memory storing software instructions that configure hardware circuitry, as well as an FPGA with configuration instructions or an ASIC. As used herein, a processor can include a single-core processor, multi-core processor on a same integrated chip, or multiple processing units on a single circuit board or networked, as well as dedicated hardware. Based on the disclosure and teachings provided herein, a person of ordinary skill in the art will know and appreciate other ways and/or methods to implement embodiments of the present disclosure using hardware and a combination of hardware and software.

Any of the software components or functions described in this application, such as processes 400, 500, 600 or 700, may be implemented as software code to be executed by a processor using any suitable computer language such as, for example, Java, C, C++, C#, Objective-C, Swift, or scripting language such as Perl or Python using, for example, conventional or object-oriented techniques. The software code may be stored as a series of instructions or commands on a computer readable medium for storage and/or transmission. A suitable non-transitory computer readable medium can include random access memory (RAM), a read only memory (ROM), a magnetic medium such as a hard-drive or a floppy disk, or an optical medium such as a compact disk (CD) or DVD (digital versatile disk) or Blu-ray disk, flash memory, and the like. The computer readable medium may be any combination of such devices. In addition, the order of operations may be re-arranged. A process can be terminated when its operations are completed, but could have additional steps not included in a figure. A process may correspond to a method, a function, a procedure, a subroutine, a subprogram, etc. When a process corresponds to a function, its termination may correspond to a return of the function to the calling function or the main function Such programs may also be encoded and transmitted using carrier signals adapted for transmission via wired, optical, and/or wireless networks conforming to a variety of protocols, including the Internet. As such, a computer readable medium may be created using a data signal encoded with such programs. Computer readable media encoded with the program code may be packaged with a compatible device or provided separately from other devices (e.g., via Internet download). Any such computer readable medium may reside on or within a single computer product (e.g., a hard drive, a CD, or an entire computer system), and may be present on or within different computer products within a system or network. A computer system may include a monitor, printer, or other suitable display for providing any of the results mentioned herein to a user.

Any of the methods described herein may be totally or partially performed with a computer system including one or more processors, which can be configured to perform the steps. Any operations performed with a processor (e.g., aligning, determining, comparing, computing, calculating) may be performed in real-time. The term "real-time" may refer to computing operations or processes that are completed within a certain time constraint. The time constraint may be 1 minute, 1 hour, 1 day, or 7 days. Thus, embodiments can be directed to computer systems configured to perform the steps of any of the methods described herein, potentially with different components performing a respective step or a respective group of steps. Although presented as numbered steps, steps of methods herein can be performed at a same time or at different times or in a different order. Additionally, portions of these steps may be used with portions of other steps from other methods. Also, all or portions of a step may be optional. Additionally, any of the steps of any of the methods can be performed with modules, units, circuits, or other means of a system for performing these steps.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom" or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/ or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In some implementations, operations or processing may involve physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining," or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. An ion beam system, comprising:
a plasma source tube defining a plasma source chamber;
a first gas reservoir housing a first gas and a second gas reservoir housing a second gas;
a first controller fluidly coupled to the first gas reservoir and configured to control a first flow rate of the first gas, and a second controller fluidly coupled to the second gas reservoir and configured to control a second flow rate of the second gas; and
a first capillary constriction including a first end fluidly coupled to the first controller and a second end fluidly coupled to the plasma source chamber, and a second capillary constriction including a third end fluidly coupled to the second controller and a fourth end fluidly coupled to the plasma source chamber, wherein the first capillary constriction and the second capillary constriction are spaced apart from each other.

2. The ion beam system of claim 1, wherein the first capillary constriction and the second capillary constriction are separated from each other.

3. The ion beam system of claim 1, wherein the first capillary constriction and the second capillary constriction are nonintersecting with each other.

4. The ion beam system of claim 1, wherein the at least one of the first controller or the second controller includes a variable outlet pressure valve.

5. The ion beam system of claim 1, further comprising a first gas supply line fluidly coupling the first gas reservoir and the first controller, and a second gas supply line fluidly coupling the second gas reservoir and the second controller, wherein the first controller is configured to fluidly isolate the first gas supply line from the first capillary constriction, and the second controller is configured to fluidly isolate the second gas supply line from the second capillary constriction.

6. The ion beam system of claim 1, further comprising a bypass manifold coupled to the plasma source tube, wherein:

the bypass manifold defines a bypass chamber in fluid communication with the plasma source chamber; and the second end of the first capillary constriction is coupled to the bypass manifold and the fourth end of the second capillary constriction is coupled to the bypass manifold.

7. The ion beam system of claim 6, wherein:

in a first state, the bypass manifold is coupled to the plasma source tube, and the first and second capillary constrictions, the bypass chamber and the plasma source chamber are fluidly isolated from a vacuum source: and in a second state, the bypass manifold is distanced from the plasma source tube, and the first and second capillary constrictions, the bypass chamber and the plasma source chamber are in fluid communication with the vacuum source.

8. The ion beam system of claim 7, further comprising a chamber body defining an interior volume housing the plasma source tube and the bypass manifold, wherein the interior volume is fluid communication with the vacuum source.

9. The ion beam system of claim 7, wherein:

the first controller includes a first relief port valve fluidly coupled to the vacuum source and the second controller includes a second relief port valve fluidly coupled to the vacuum source; and in the second state, the first controller is configured to fluidly couple the first capillary constriction to the first relief port valve and the second controller is configured to fluidly couple the second capillary constriction to the second relief port valve.

10. An ion beam system, comprising:

a plasma source tube defining a plasma source chamber;

a first gas reservoir housing a first gas species and a second gas reservoir housing a second gas species;

a first controller fluidly coupled to the first gas reservoir and configured to control a first flow rate of the first gas species;

a second controller fluidly coupled to the second gas reservoir and configured to control a second flow rate of the second gas species;

a first capillary constriction including a first end fluidly coupled to the first controller and a second end fluidly coupled to the plasma source chamber; and a second capillary constriction including a third end fluidly coupled to the second controller and a fourth end fluidly coupled to the plasma source chamber, wherein the first capillary constriction and the second capillary constriction are separated from each other.

11. The ion beam system of claim 10, further comprising a computer system in communication with the first controller and configured to provide instructions to operate the first controller.

12. The ion beam system of claim 10, wherein the first controller includes a variable outlet pressure valve.

13. The ion beam system of claim 10, further comprising a first gas supply line fluidly coupling the first gas reservoir and the first controller, wherein the first controller is configured to fluidly isolate the first gas supply line from the first capillary constriction.

14. An ion beam system, comprising:

a plasma source tube defining a plasma source chamber;

a first gas reservoir housing a first gas species and a second gas reservoir housing a second gas species;

a first controller fluidly coupled to the first gas reservoir and configured to control a first flow rate of the first gas species;

a first capillary constriction including a first end fluidly coupled to the first controller and a second end fluidly coupled to the plasma source chamber; and a bypass manifold coupled to the plasma source tube, wherein:

the bypass manifold defines a bypass chamber in fluid communication with the plasma source chamber; and the second end of the first capillary constriction is coupled to the bypass manifold.

15. The ion beam system of claim 14, wherein:

in a first state, the bypass manifold is coupled to the plasma source tube, and the first capillary constriction, the bypass chamber and the plasma source chamber are fluidly isolated from a vacuum source: and in a second state, the bypass manifold is distanced from the plasma source tube, and the first capillary constriction, the bypass chamber and the plasma source chamber are in fluid communication with the vacuum source.

16. The ion beam system of claim 15, further comprising a chamber body defining an interior volume housing the plasma source tube and the bypass manifold, wherein the interior volume is fluid communication with the vacuum source.

17. The ion beam system of claim 15, wherein:

the first controller includes a first relief port valve fluidly coupled to the vacuum source; and in the second state, the first controller is configured to fluidly couple the first capillary constriction to the first relief port valve.

18. A non-transitory computing-device readable storage medium on which computing-device readable instructions of a program are stored, the instructions, when executed by one or more computing devices, causing the one or more computing devices to perform operations comprising:

instructing a first controller to open a first variable outlet pressure valve to release a first gas from a first gas reservoir at a first flow rate into a plasma source chamber defined in a plasma source tube via a first capillary constriction; and instructing a second controller to open a second variable outlet pressure valve to release a second gas from a second gas reservoir at a second flow rate into the plasma source chamber via a second capillary constriction such that the first and second gas mix in the plasma source chamber, wherein the second capillary constriction is nonintersecting with the first capillary constriction.

19. The non-transitory computing-device readable storage medium of claim 18, wherein:

the first gas and the second gas are respectively released from the first capillary constriction and the second capillary constriction into a bypass chamber defined in a bypass manifold;

the bypass manifold is coupled to the plasma source tube; and the bypass chamber is fluidly isolated from a vacuum source; and the operations further comprise instructing a bypass actuator to move the bypass manifold away from the plasma source tube such that the first and second capillary constrictions, the bypass chamber, and the plasma source chamber are in fluid communication with the vacuum source.

20. The non-transitory computing-device readable storage medium of claim 19, wherein the operations further comprise opening a first relief port valve included in the first controller to fluidly couple the first capillary constriction to the vacuum source and opening a second relief port valve included in the second controller to fluidly couple the second capillary constriction to the vacuum source.

* * * * *